United States Patent [19]

Nilssen

[11] Patent Number: 5,757,140
[45] Date of Patent: May 26, 1998

[54] ELECTRONIC BALLAST WITH FREQUENCY CONTROL

[76] Inventor: Ole K. Nilssen, Caesar Dr., Barrington, Ill. 60010

[21] Appl. No.: 851,887

[22] Filed: Mar. 16, 1992

Related U.S. Application Data

[63] Continuation of Ser. No. 819,655, Jan. 13, 1992, Pat. No. 5,191,262, which is a continuation of Ser. No. 643,023, Jan. 18, 1991, abandoned, which is a continuation-in-part of Ser. No. 787,692, Oct. 15, 1985, abandoned, which is a continuation of Ser. No. 644,155, Aug. 27, 1984, abandoned, which is a continuation of Ser. No. 555,426, Nov. 23, 1983, abandoned, which is a continuation of Ser. No. 178,107, Aug. 14, 1980, abandoned, said Ser. No. 555,426, Nov. 23, 1983, is a continuation-in-part of Ser. No. 330,159, Dec. 14, 1981, Pat. No. 4,430,628, which is a division of Ser. No. 973,741, Dec. 28, 1978, abandoned, which is a continuation-in-part of Ser. No. 890,586, Mar. 20, 1978, Pat. No. 4,184,128.

[51] Int. Cl.$^6$ .................................................. H05B 41/36
[52] U.S. Cl. ................ 315/209 R; 315/219; 315/DIG. 4
[58] Field of Search ........................ 315/209 R, 219, 315/DIG. 4, DIG. 5, DIG. 7, 220, 224, 240, 53, 276, 278, 279, 307; 331/113 A

[56] References Cited

U.S. PATENT DOCUMENTS

| | | | |
|---|---|---|---|
| 3,026,486 | 3/1962 | Pintell | 331/117 |
| 3,733,541 | 5/1973 | Elms | |
| 4,071,812 | 1/1978 | Walker | 363/80 |
| 4,184,128 | 1/1980 | Nilssen | |
| 4,266,134 | 5/1981 | Franke et al. | 250/409 |
| 4,307,353 | 12/1981 | Nilssen | |
| 4,513,364 | 4/1985 | Nilssen | |
| 4,677,345 | 6/1987 | Nilssen | |
| 4,682,084 | 7/1987 | Kuhnel et al. | |
| 4,712,170 | 12/1987 | Grace | |
| 4,723,098 | 2/1988 | Grubbs | |
| 4,857,806 | 8/1989 | Nilssen | |
| 5,047,690 | 9/1991 | Nilssen | |
| 5,191,262 | 3/1993 | Nilssen | |

OTHER PUBLICATIONS

Bedfor et al. Principles of Inverter Circuit, John Wiley & Sons, Inc., 1964, pp. 287–300.

*Primary Examiner*—Ali Neyzari

[57] ABSTRACT

A half-bridge inverter is powered from a constant DC voltage and loaded by way of an L-C circuit that has a natural resonance frequency equal to or lower than the inverter's operating frequency. A gas discharge lamp is disconnectably connected across the tank capacitor of the L-C circuit and, when indeed so connected, is provided with a current-limited high-frequency (30 kHz) voltage. The magnitude of the resulting lamp current decreases as the inverter's operating frequency is increased; which operating frequency is controlled by way of a negative feedback arrangement that causes the frequency to increase as a function of increasing magnitude of the current flowing through the tank capacitor. Thus, particularly with the lamp disconnected, the magnitude of the current flowing through the capacitor—and therefore also the magnitude of the voltage existing across it—will be regulated so as to be lower than it would be in the absence of the negative feedback.

29 Claims, 5 Drawing Sheets

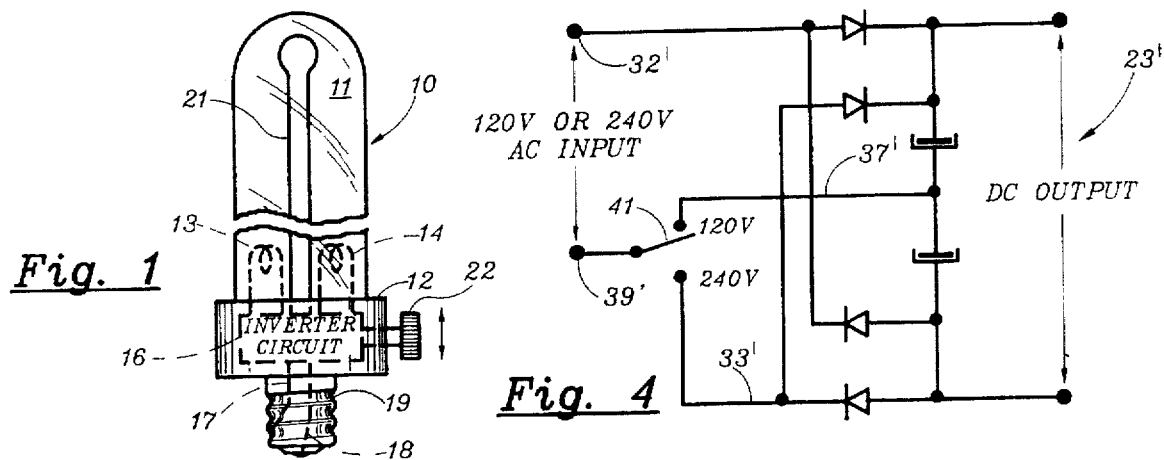
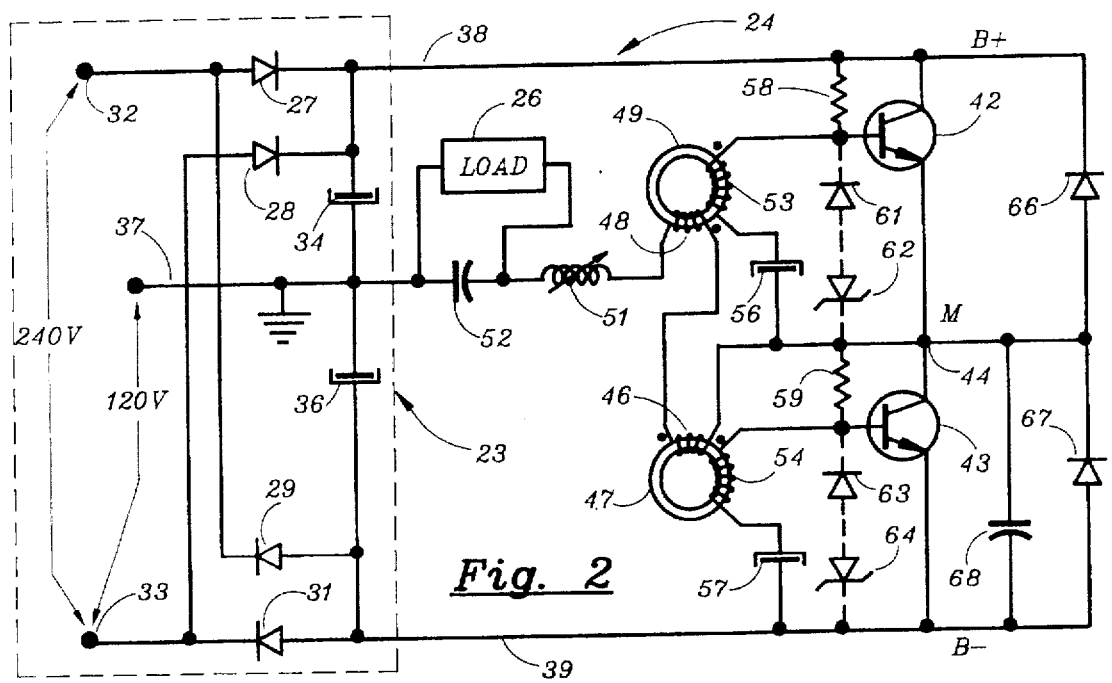
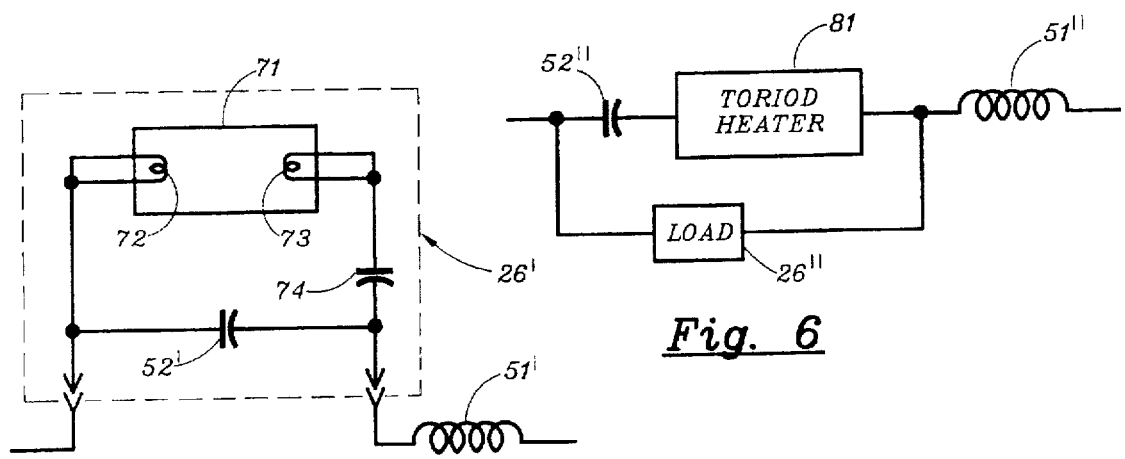

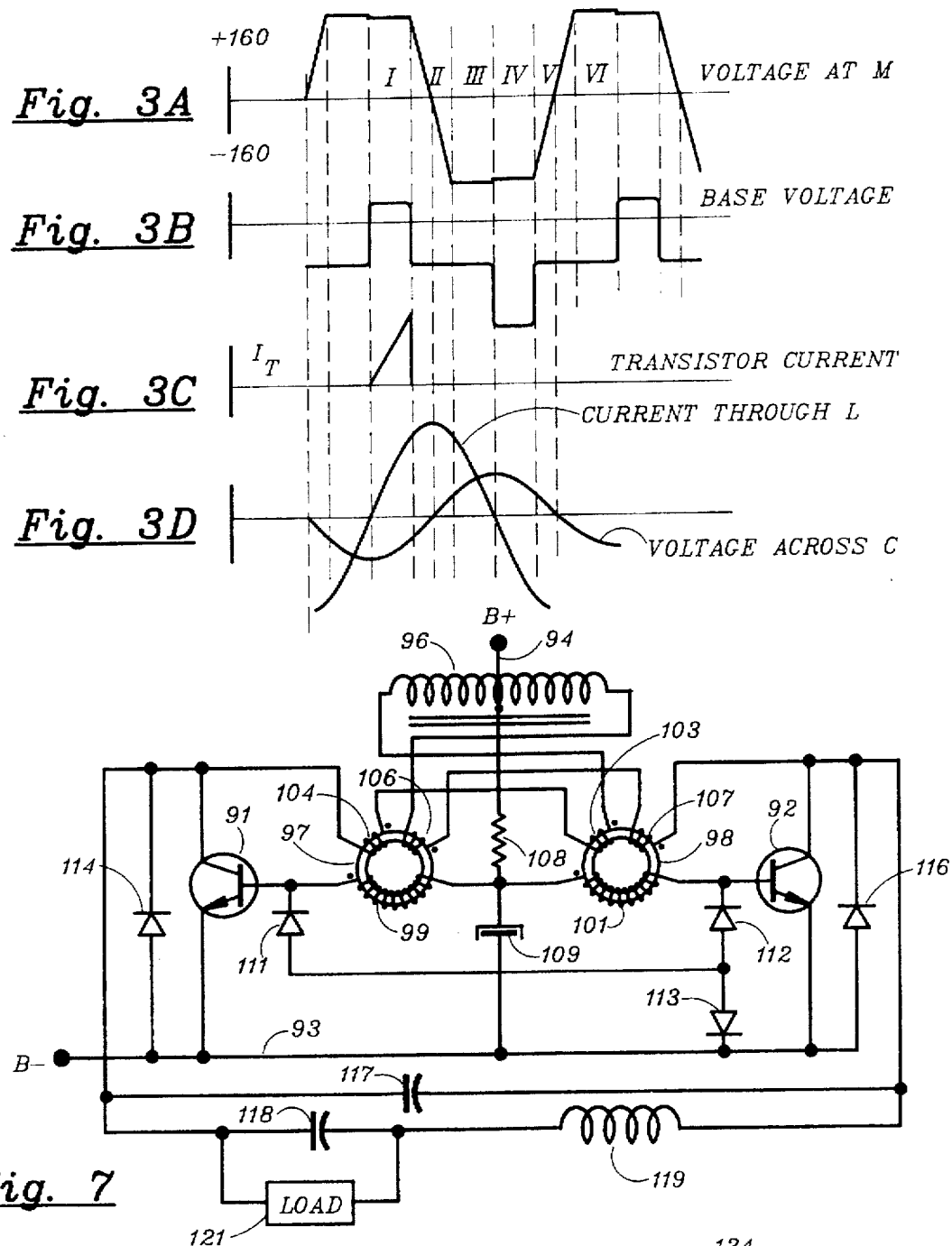
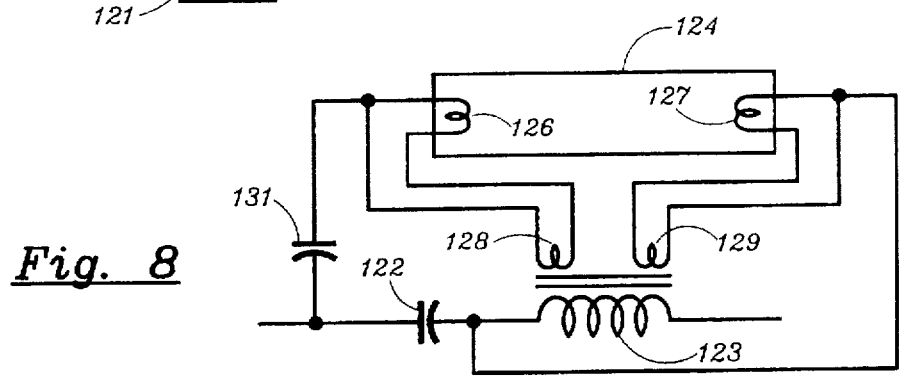

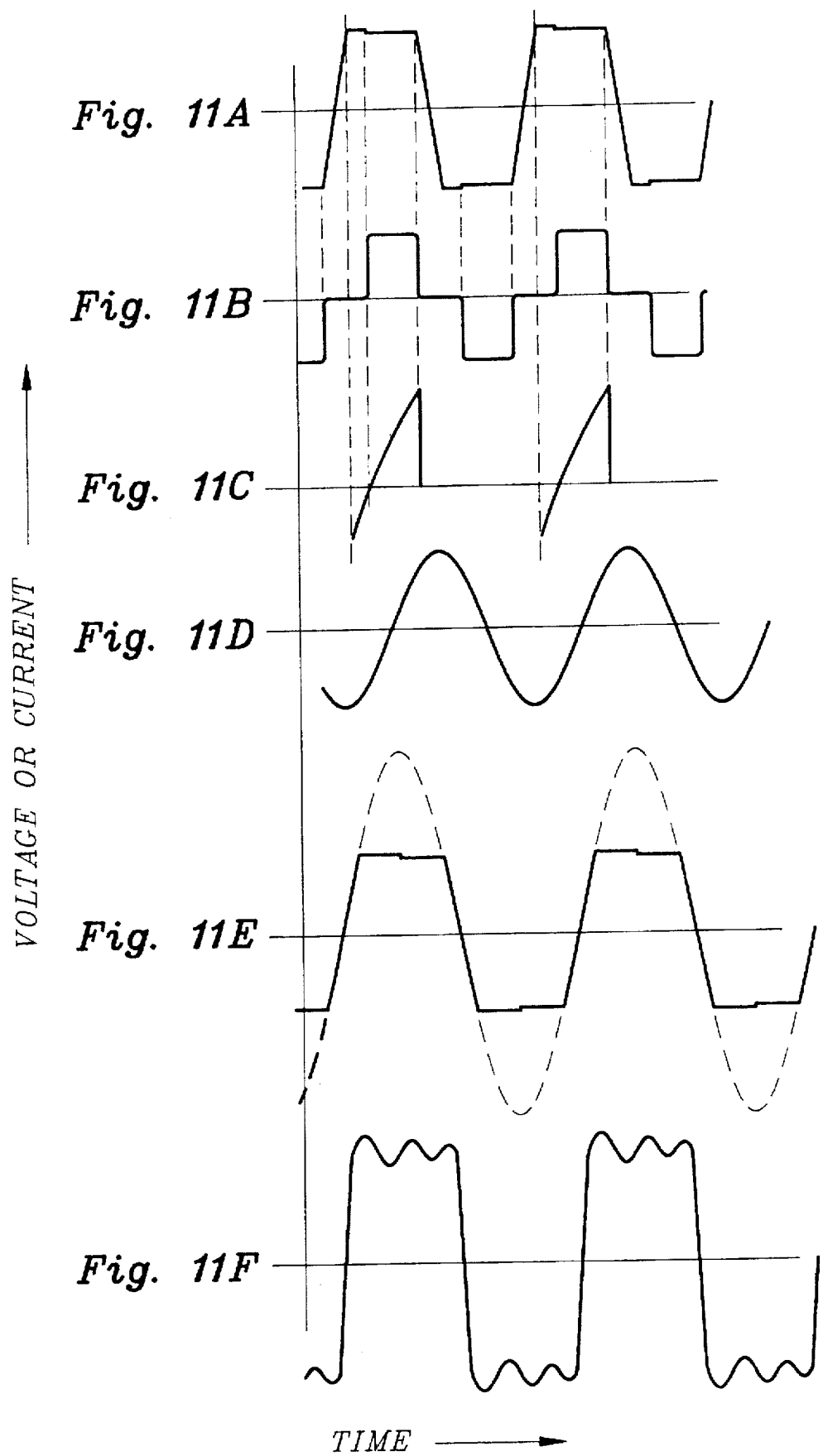

VOLTAGE OR CURRENT

TIME

5,757,140

ELECTRONIC BALLAST WITH FREQUENCY CONTROL

RELATED APPLICATIONS

The present application is a Continuation of Ser. No. 07/819,655 filed Jan. 13, 1992 now U.S. Pat. No. 5,191,262; which is a Continuation of Serial No. 07/643,023 filed Jan. 18, 1991 now abandoned; which is a Continuation-in-Part of Ser. No. 06/787,692 filed Oct. 15, 1985 now abandoned; which is a Continuation of Ser. No. 06/644,155 filed Aug. 27, 1994, now abandoned; which is a Continuation of Ser. No. 06/555,426 filed Nov. 23, 1983, now abandoned; which is a Continuation of Ser. No. 06/178,107 filed Aug. 14, 1980, now abandoned; which Ser. No. 06/555,426 is also a Continuation-in-Part of Ser. No. 06/330,159 filed Dec. 14, 1981, now U.S. Pat. No. 4,430,628; which is a Division of Ser. No. 05/973,741 filed Dec. 28, 1978, now abandoned; which is a Continuation-in-Part of Ser. No. 05/890,586 filed Mar. 20, 1978, now U.S. Pat. No. 4,184,128.

BACKGROUND OF THE INVENTION

1. Field of Invention

This invention relates to ballasting means for gas discharge lighting means.

2. Description of Prior Art

For a description of pertinent prior art, reference is made to U.S. Pat. No. 4,677,345 to Nilssen; which patent issued from a Division of application Ser. No. 06/178,107 filed Aug. 14, 1980; which application is the original in-part progenitor of instant application. Also, reference is made to U.S. Pat. No. 3,263,122 to Genuit; No. 3,320,510 to Locklair; No. 3,996,493 to Davenport et el.; No. 4,100,476 to Ghiringhelli; No. 4,262,327 to Kovacik et al.; No. 4,370,600 to Zansky; No. 4,634,932 to Nilssen; and No. 4,857,806 to Nilssen.

SUMMARY OF THE INVENTION

Objects of the Invention

A main object of the present invention is that of providing a cost-effective ballasting means for gas discharge lamps.

This as well as other objects, features and advantages of the present invention will become apparent from the following description and claims.

Brief Description of the Invention

A half-bridge inverter is powered from a constant DC voltage and loaded by way of an L-C circuit that has a natural resonance frequency equal to or lower than the inverter's operating frequency. A gas discharge lamp is disconnectably connected across the tank capacitor of the L-C circuit and, when indeed so connected, is provided with a current-limited high-frequency (30 kHz) voltage. The magnitude of the resulting lamp current decreases as the inverter's operating frequency is increased; which operating frequency is controlled by way of a negative feedback arrangement that causes the frequency to increase as a function of increasing magnitude of the current flowing through the tank capacitor. Thus, particularly with the lamp disconnected, the magnitude of the current flowing through the capacitor—and therefore also the magnitude of the voltage existing across it—will be regulated so as to be lower than it would be in the absence of the negative feedback.

Otherwise, in the form of another embodiment, in an electronic inverter-type ballast for a gas discharge lamp, a basic and significant problem associated with powering the lamp by way of a current-limiting inductance means more-or-less directly from the inverter's high-frequency (e.g. 30 kHz) squarewave voltage (as opposed to first shaping this squarewave voltage into a sinusoidal voltage by way of a tuned circuit) is that of spurious resonances occurring due to resonant interactions (at harmonic components of the squarewave voltage) between the effective output inductance represented by the current-limiting inductance means and the unavoidable stray capacitance associated with the output wiring means used for connecting between the ballast's output and the lamp. This problem is mainly significant during periods of open circuit operation (such as prior to lamp ignition); but during those periods, the spurious resonances are apt to cause excessive power dissipations within the ballast, thereby potentially causing damage to the ballast. Since the particular capacitance value associated with the output wiring means is an unknown—being dependent on some unknown end-use situation—it is not feasible in a straight forward manner simply to tune the ballast output inductance and/or the inverter's operating frequency such as to avoid these spurious resonances.

Of course, the reason these spurious resonances occur in the first place is that the inverter's squarewave voltage contains a substantial amount of odd harmonic components. In particular, it contains one third (i.e. 33.3%) third harmonics, one fifth (i.e., 20.0%) fifth harmonics, etc.

The usual approach to avoiding the above-mentioned problem of uncontrollable spurious resonances is that of powering the lamp by way of a tuned circuit resonantly tuned to the fundamental component of the inverter's squarewave voltage; and, as a result of this tuning, the problems associated with the harmonic components are substantially eliminated.

In an initial preferred embodiment of the present invention, a half-bridge inverter is powered from a constant DC voltage and provides an AC output voltage that is—in contrast with the usual squarewave voltage—describable as being a sinusoidal waveform with the tops clipped off at some fixed magnitude; or, described differently, a waveform composed of truncated sinusoidal waves; or, described still differently, a waveform having trapezoidally shaped half-cycles. This AC voltage is applied across the primary winding of a so-called reactance transformer, whose loosely coupled secondary winding is connected across a gas discharge lamp. The internal inductive reactance of the secondary winding constitutes a lamp ballasting means by way of limiting the magnitude of the resulting lamp current to a pre-established desired level. Potentially damaging spurious or parasitic resonances—which are very likely to occur under actual operational circumstances with an unloaded secondary winding when the primary winding is supplied with a squarewave voltage—are avoided because of the truncated sinusoidal waveshape of the AC voltage; which truncated sinusoidal shape is efficiently attained by a combination of three factors: (i) using rapidly switching transistors in the inverter; (ii) having the transformer's primary winding exhibit a substantial shunt inductance; and (iii) providing for a slow-down capacitor coupled directly across the primary winding, thereby to substantially slow down the rise time of the inverter's output voltage as conpared with what it would have been if it were to have been determined solely by the high switching speed of the transistors.

Otherwise and more generally, the present invention is directed to providing improved gas discharge lighting means and inverter circuits for powering and controlling gas discharge lamps. The inverter circuits according to the present invention are highly efficient, can be compactly constructed and are ideally suited for energizing gas discharge lamps, particularly compact folded "instant-start" "self-ballasted" fluorescent lamps.

According to one feature of the present invention, a series-connected combination of an inductor and a capacitor is provided in circuit with the inverter transistors to be energized upon periodic transistor conduction. Transistor drive current is preferably provided through the use of at least one saturable inductor to control the transistor inversion frequency to be equal to or greater than the natural resonant frequency of the inductor and capacitor combination. The high voltages efficiently developed by loading the inverter with the inductor and capacitor are ideally suited for energizing external loads such as gas discharge lamps. In such an application, the use of an adjustable inductor permits control of the inverter output as a means of adjusting the level of lamp illumination.

According to another feature of the present invention, reliable and highly efficient half-bridge inverters include a saturable inductor in a current feedback circuit to drive the transistors for alternate conduction. The inverters also include a load having an inductance sufficient to effect periodic energy storage for self-sustained transistor inversion. Importantly, improved reliability is achieved because of the relatively low and transient-free voltages across the transistors in these half-bridge inverters.

Further, according to another feature of the present invention, novel and economical power supplies particularly useful with the disclosed inverter circuits convert conventional AC input voltages to DC for supplying to the inverters.

Yet further, according to still another feature of the invention, a rapid-start fluorescent lamp is powered by way of a series-resonant LC circuit; while heating power for the lamp's cathodes is provided via loosely-coupled auxiliary windings on the tank inductor of the LC circuit. Alternatively, cathode heating power is provided from tightly-coupled windings on the tank inductor; in which case output current-limiting is provided via a non-linear resistance means, such as an incandescent filament in a light bulb, connected in series with the output of each winding.

BRIEF DESCRIPTION OF THE DRAWINGS

FIG. 1 is a front elevation of a folded fluorescent lamp unit adapted for screw-in insertion into a standard Edison incandescent socket;

FIG. 2 is a schematic diagram illustrating the essential features of a push-pull inverter circuit particularly suitable for energizing the lamp unit of FIG. 1;

FIG. 3A-3D is a set of waveform diagrams of certain significant voltages and currents occurring in the circuit of FIG. 2;

FIG. 4 is a schematic diagram of a DC power supply connectable to both 120 and 240 volt AC inputs;

FIG. 5 is a schematic diagram which illustrates the connection of a non-self-ballasted gas discharge lamp unit to the FIG. 2 inverter circuit;

FIG. 6 is a schematic diagram which illustrates the use of a toroid heater for regulation of the inverter output;

FIG. 7 is an alternate form of push-pull inverter circuit accordind to the present invention;

FIG. 8 is a schematic diagram showing the connection of a gas discharge lamp of the "rapid-start" type to an inductor-capacitor-loaded inverter according to the present invention;

FIG. 11A-11H show various voltage and current waveforms associated with the circuit arrangement of FIG. 9.

Figures 9, 10:
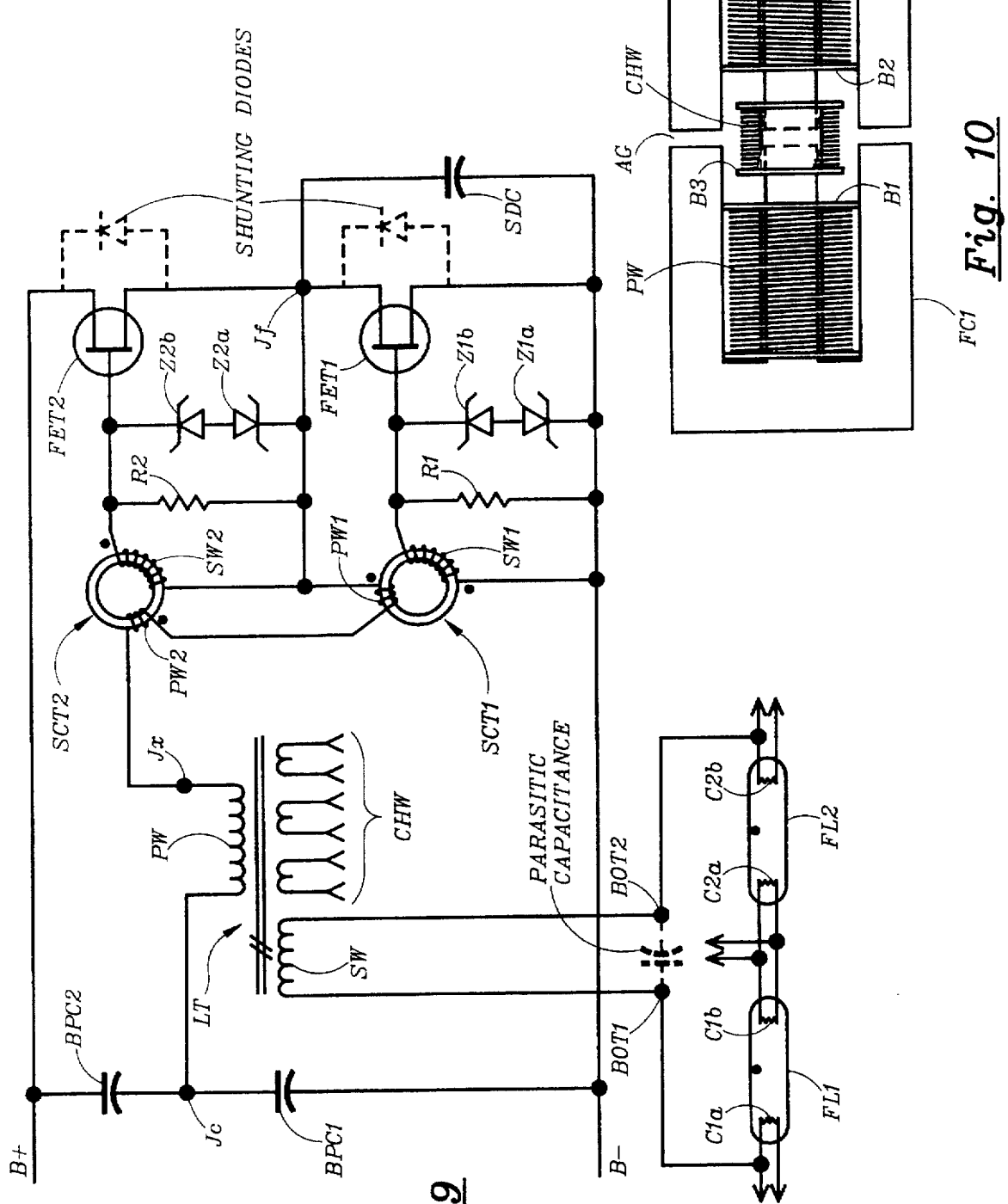
FIG. 9 is a schematic diagram illustrating an inverter ballast circuit arrangement wherein a pair of series-connected fluorescent lamps is powered, by way of a reactance transformer, from an inverter output voltage having a trapezoidal (i.e. truncated sinewave) waveform like that of FIG. 3A.
FIG. 10 is a schematic illustration of the reactance transformer used in the circuit arrangement of FIG. 9.

DESCRIPTION OF THE PREFERRED
EMBODIMENTS

FIG. 1 illustrates a screw-in gas discharge lamp unit 10 comprising a folded fluorescent lamp 11 suitably secured to an integral base 12. The lamp comprises two cathodes 13, 14 which are supplied with the requisite high operating voltage from a frequency-converting power supply and ballasting circuit 16; which, because of its compact size, conveniently fits within the base 12. The inverter circuit 16 is connected by leads 17, 18 to a screw-type plug 19 adapted for screw-in insertion into a standard Edison-type incandescent lamp socket at which ordinary 120Volt/60Hz power line voltage is available. A ground plane comprising a wire or metallic strip 21 is disposed adjacent a portion of the fluorescent lamp 11 as a starting aid. Finally, a manually rotatable external knob 22 is connected to a shaft for mechanical adjustment of the air gap of a ferrite core inductor to vary the inductance value thereof in order to effect adjustment of the inverter voltage output connected to electrodes 13, 14 for controlled variation of the lamp illumination intensity.

With reference to FIG. 2, a power supply 23, connected to a conventional AC input, provides a DC output for supplying a high-efficiency inverter circuit 24. The inverter is operable to provide a high voltage to an external load 26, which may comprise a gas discharge device sich as the fluorescent lamp 11 of FIG. 1.

The power supply 23 comprises bridge rectifier having four diodes 27, 28, 29 and 31 connectable to a 240 volt AC supply at terminals 32, 33. Capacitors 34, 36 are connected between a ground line 37 (in turn directly connected to the inverter 24) and to a B+ line 38 and a B− line 39, respectively. The power supply 23 also comprises a voltage doubler and rectifier optionally connectable to a 120 volt AC input taken between the ground line 37 and terminal 33 0r 32. The voltage doubler and rectifier means provides a direct electrical connection by way of line 37 netween one of the 120 volt AC power input lines and the inverter 24, as shown in FIG. 2. The bridge rectifier and the voltage doubler and rectifier provide substantially the same DC output voltage to the inverter 24 whether the AC input is 120 or 240 volts. Typical voltages are +160 volts on the B+ line 38 and −160 volts on the B− line 39.

With additional reference to FIG. 4, which shows an alternate power supply 23', the AC input, whether 120 or 240 volts, is provided at terminals 32' and 39. Terminal 39 is in turn connected through a single-pole double-throw selector switch 41 to terminal 37' (for 120 volt operation) or terminal 33' (for 240 volt operation). In all other respects, power supplies 23 and 23' are identical.

The inverter circuit 24 of FIG. 2 is a half-bridge inverter comprising transistors 42, 43 connected in series across the DC voltage output of the power supply 23 on B+ and B− lines 38 and 39, respectively. The collector of trasistor 42 is connected to the B+ line 38, the emitter of transistor 42 and the collector of transistor 43 are connected to a midpoint line 44 (designated "M") and the emitter of transistor 43 is connected to the B– line 39. The midpoint line 44 is in turn connected to the ground line 37 through primary winding 46 of a toroidal saturable core transformer 47, a primary winding 48 on an identical transformer 49, an inductor 51 and a series-connected capacitor 52. The inductor 51 and capacitor 52 are energized upon alternate transistor conduction in a manner to be described later.

An external load 26 is preferably taken off capacitor 52, as shown in FIG. 2. The inductor 51, preferably a known ferrite core inductor, has an inductance variable by mechanical adjustment of the air gap in order to effect variation in the level of the inductor and capacitor voltage and hence the power available to the load, as will be described. When the load is a gas discharge lamp such as lamp 11 in FIG. 1, variation in this inductance upon rotation of knob 22 accomplishes a lamp dimming effect.

Drive current to the base terminals of transistors 42 and 43 is provided by secondary windings 53, 54 of transformers 49, 47, respectively. Winding 53 is also connected to midpoint lead 44 through a bias capacitor 56, while winding 54 is connected to the B– lead 39 through an identical bias capacitor 57. The base terminals of transistors 42 and 43 are also connected to lines 38 and 44 through bias resistors 58 and 59, respectively. For a purpose to be described later, the base of transistor 42 can be optionally connected to a diode 61 and a series Zener diode 62 in turn connected to the midpoint line 44; similarly, a diode 63 and series Zener diode 64 in turn connected to the B– line 39 can be connected to the base of transistor 43. Shunt diodes 66 and 67 are connected across the collector-emitter terminals of transistors 42 and 43, respectively. Finally, a capacitor 68 is connected across the collector-emitter terminals of transistor 43 to restrain the rate of voltage rise across those terminals, as will be seen presently.

The operation of the circuit of FIG. 2 can best be understood with additional reference to FIG. 3, which illustrates significant portions of the waveforms of the voltage at midpoint M (FIG. 3A), the base-emitter voltage on transistor 42 (FIG. 3B), the current through transistor 42 (FIG. 3C), and the capacitor 52 voltage and the inductor 51 current (FIG. 3D).

Assuming that transistor 42 is first to be triggered into conduction, current flows from the B+ line 38 through windings 46 and 48 and the inductor 51 to charge capacitor 52 and returns through capacitor 34 (refer to the time period designated I in FIG. 3). When the saturable inductor 49 saturates at the end of period I, drive current to the base of transistor 42 will terminate, causing voltage on the base of the transistor to drop to the negative voltage stored on the bias capacitor 56 in a manner to be described, causing this transistor to become nonconductive. As shown in FIG. 3c, current-flow in transistor 43 terminates at the end of period I.

Because the current through inductor 51 cannot change instantaneously, current will flow from the B– bus 39 through capacitor 68, causing the voltage at midpoint line 44 to drop to –160 volts (period II in FIG. 3). The capacitor 68 restrains the rate of voltage change across the collector and emitter terminals of transistor 42. The current through the inductor 51 reaches its maximum value when the voltage at the midpoint line 44 is zero. During period III, the current will continue to flow through inductor 51 but will be supplied from the B– bus through the shunt diode 67. It will be appreciated that during the latter half of period II and all of period III, positive current is being drawn from a negative voltage; which, positive current is being drawn from a negative voltage; which, in reality, means that energy is being returned to the power supply through a path of relatively low impedance.

When the inductor current reaches zero at the start of period IV, the current through the primary winding 46 of the saturable inductor 47 will cause a current to flow out of its secondary winding 54 to cause transistor 43 to become conductive, thereby causing a reversal in the direction of current through inductor 51 and capacitor 52. When transformer 47 saturates at the end of period IV, the drive current to the base of transistor 43 terminates and the current through inductor 51 will be supplied through capacitor 68, causing the voltage at midpoint line 44 to rise (period V). When the voltage at the midpoint line M reaches 160 volts, the current will then flow through shunt diode 66 (period VI). The cycle is then repeated.

As seen in FIG. 3, saturable transformers 47, 49 provide transistor drive current only after the current through inductor 51 has diminished to zero. Further, the transistor drive current is terminated before the current through inductor 51 has reached its maximum amplitude. This coordination of base drive current and inductor current is achieved because of the series-connection between the inductor 51 and the primary windings 46, 48 of saturable transformers 47, 49, respectively.

The series-connected combination of the inductor 51 and the capacitor 52 is energized upon the alternate conduction of transistors 42 and 43. With a large value of capacitance of capacitor 52, very little voltage will be developed across its terminals. As the value of this capacitance is decreased, however, the voltage across this capacitor will increase. As the value of the capacitor 52 is reduced to achieve resonance with the inductor 51, the voltage on the capacitor will rise and become infinite in a loss-free circuit operating under ideal conditions.

It has been found desirable to regulate the transistor inversion frequency, determined mainly by the saturation time of the saturable inductors 47, 49, to be equel to or higher than the natural resonance frequency of the inductor and capacitor combination in order to provide a high voltage output to external load 26. A high voltage across capacitor 52 is efficiently developed as the transistor inversion frequency approaches the natural resonant frequency of the inductor 51 and capacitor 52 combination. Stated another way, the conduction period of each transistor is desirably shorter in duration than one quarter of the full period corresponding to the natural resonant frequency of the inductor and capacitor combination. When the inverter 24 is used with a self-ballasted gas discharge lamp unit, it has been found that the inversion frequency can be at least equal to the natural resonant frequency of the tank circuit. If the capacitance value of capacitor 52 is reduced still further beyond the resonance point, unacceptably high transistor currents will be experienced during transistor switching and transistor burn-out will occur.

It will be appreciated that the sizing of capacitor 52 is determined by the application of the inverter circuit 24. Variation in the values of the capacitor 52 and the inductor 51 will determine the voltages developed in the inductor-capacitor tank circuit. The external load 26 may be connected in circuit with the inductor 51 (by a winding on the inductor, for example) and the capacitor may be omitted entirely. If the combined circuit loading of the inductor 51 and the external load 26 has an effective inductance of value sufficient to effect periodic energy storage for self-sustained transistor inversion, the current feedback provided by the saturable inductors 47, 49 will effect alternate transistor conduction without the need for additional voltage feedback. When the capacitor 52 is omitted, the power supply 23 provides a direct electrical connection between one of the AC power input lines and the inverter load circuit.

Because the voltages across transistors 42, 43 are relatively low (due to the effect of capacitors 34, 36), the half-bridge inverter 24 is very reliable. The absence of switching transients minimizes the possibility of transistor burn-out.

The inverter circuit 24 comprises means for supplying reverse bias to the conducting transistor upon saturation of its associated saturable inductor. For this purpose, the capacitors 56 and 57 are charged to negative voltages as a result of reset current flowing into secondary windings 53, 54 from the bases of transistors 42, 43, respectively. This reverse current rapidly turns off a conducting transistor to increase its switching speed and to achieve inverter circuit efficiency in a manner described more fully in my co-pending U.S. patent application Ser. No. 103.624 filed Dec. 14, 1979 and entitled "Bias Control for High Efficiency Inverter Circuit" (now U.S. Pat. No. 4,307,353). The more negative the voltage on the bias capacitors 56 and 57, the more rapidly charges are swept out of the bases of their associated transistors upon transistor turn-off.

When a transistor base-emitter junction is reversely biased, it exhibits the characteristics of a Zener diode having a reverse breakdown voltage on the order of 8 to 14 Volt for transistors typically used in high-voltage inverters. As an alternative, to provide a negative voltage smaller in magnitude on the base lead of typical transistor 42 during reset operation, the optional diode 61 and Zener diode 62 combination can be used. For large values of the bias capacitor 56, the base voltage will be substantially constant.

If the load 26 comprises a gas discharge lamp, the voltage across the capacitor 52 will be reduced once the lamp is ignited to prevent voltages on the inductor 51 and the capacitor 52 from reaching destructive levels. Such a lamp provides an initial time delay during which a high voltage, suitable for instant starting, is available.

FIG. 5 illustrates the use of an alternate load 26' adapted for plug-in connection to an inverter circuit such as shown in FIG. 2. The load 26' consists of a gas discharge lamp 71 having electrodes 72, 73 and connected in series with a capacitor 74. The combination of lamp 71 and capacitor 74 is connected in parallel with a capacitor 52' which serves the same purpose as capacitor 52 in the FIG. 2 circuit. However, when the load 26' is unplugged from the circuit, the inverter stops oscillating and the development of high voltages in the inverter is prevented. The fact that no high voltages are generated by the circuit if the lamp is disconnected while the circuit is oscillating is important for safety reasons.

FIG. 6 illustrates a capacitor 52" connected in series with an inductor 51" through a heater 81 suitable for heating the toroidal inductors 47, 49 in accordance with the level of output. The load 26" is connected across the series combination of the capacitor 52" and the toroid heater. The heater 81 is preferably designed to controllably heat the toroidal saturable inductors in order to decrease their saturation flux limit and hence their saturation time. The result is to decrease the periodic transistor conduction time and thereby increase the transistor inversion frequency. When a frequency-dependent impedance means, that is, an inductor or a capacitor, is connected in circuit with the AC voltage output of the inverter, change in the transistor inversion frequency will modify the impedance of the frequency-dependent impdance means and correspondingly modify the inverter output. Thus as the level of the output increases, the toroid heater 81 is correspondingly energized to effect feedback regulation of the output. Further, transistors 42, 43 of the type used in high voltage inverters dissipate heat during periodic transistor conduction. As an alternative, the toroid heater 81 can use this heat for feedback regulation of the output or control of the temperature of transistors 42, 43.

The frequency dependent impedance means may also be used in a circuit to energize a gas discharge lamp at adjustable illumination levels. Adjustment in the inversion frequency of transistors 42, 43 results in control of the magnitude of the AC current supplied to the lamp. This is preferably accomplished where saturable inductors 47, 49 have adjustable flux densities for control of their saturation time.

FIG. 7 schematically illustrates an alternate form of inverter circuit, shown without the AC to DC power supply connections for simplification. In this Figure, the transistors are connected in parallel rather than in series but the operation is essentially the same as previously described.

In particular, this circuit comprises a pair of alternately conducting transistors 91, 92. The emitter terminals of the transistors are connected to a B– line 93. A B+ lead 94 is connected to the center-tap of a transformer 96. In order to provide drive current to the transistors 91, 92 for control of their conduction frequency, saturable inductors 97, 98 have secondary windings 99, 101, respectively, each secondary winding having one end connected to the base of its associated transistor; the other ends are connected to a common terminal 102. One end of transformer 96 is connected to the collector of transistor 91 through a winding 103 on inductor 98 in turn connected in series with a winding 104 on inductor 97. Likewise, the other end of transformer 96 is connected to the collector of transistor 92 through a winding 106 on inductor 97 in series with another winding 107 on inductor 98.

The B+ terminal is connected to terminal 102 through a bias resistor 108. A bias capacitor 109 connects terminal 102 to the B– lead 93. This resistor and capacitor serve the same function as resistors 58, 59 and capacitors 56, 57 in the FIG. 2 circuit.

The bases of transistors 91, 92 are connected by diodes 111, 112, respectively, to a common Zener diode 113 in turn connected to the B– lead 93. The common Zener diode 113 serves the same function as individual Zener diodes 62, 64 in FIG. 2.

Shunt diodes 114, 116 are connected across the collector-emitter terminals of transistors 91, 92, respectively.

A capacitor 117 connecting the collectors of transistors 91, 92 restrains the rate of voltage rise on the collectors in a manner similar to the collector-emitter capacitor 68 in FIG. 2.

Inductive-capacitive loading of the FIG. 7 inverter is accomplished by a capacitor 118 connected in series with with an inductor 119, the combination being connected across the collectors of the transistors 91, 92. A load 121 is connected across the capacitor 118.

FIG. 8 illustrates how an inverter loaded with a series capacitor 122 and inductor 123 can be used to energize a "rapid-start" fluorescent lamp 124 (the details of the inverter circuit being omitted for simplication). The lamp 124 has a pair of cathodes 126, 127 connected across the capacitor 122 for supply of operating voltage in a manner identical to that previously described. In addition, the inductor 123 comprises a pair of magnetically-coupled auxiliary windings 128, 129 for electrically heating the cathodes 126, 127, respectively. A small capacitor 131 is connected in series with lamp 124.

FIG. 9 shows an embodiment of the present invention that is expressly aimed at an alternative way of taking advantage of the fact that the inverter output voltage of the inverter circuit arrangement of FIG. 2 has the particular trapezoidal waveshape illustrated by FIG. 3A.

In FIG. 9, a DC supply voltage of about 320 Volt is assumed to be provided between a B− bus and a B+ bus.

A first high-frequency bypass capacitor BPC1 is connected between the B− bus and a junction Jc; and a second high-frequency bypass capacitor BPC2 is connected between junction Jc and the B+ bus. The source of a first field effect transistor FET1 is connected with the B− bus, while the drain of this same transistor is connected with a junction Jf. The source of a second field effect transistor FET2 is connected with junction Jf, while the drain of this same transistor is connected with the B+ bus. As shown in dashed outline, each field effect transistor has a commutating diode built-in between its drain and source. A slow-down capacitor SDC is connected between junction Jf and the B− bus.

The primary winding PW of a leakage transformer LT is connected between junction Jc and a junction Jx; the primary winding PW1 of a first saturable current transformer SCT1 is series-connected with the primary winding PW2 of a second saturable current transformer SCT2 between junctions Jf and Jx.

A secondary winding SW1 of transformer SCT1 is connected between the source and gate terminals of FET1; and a secondary winding SW2 of transformer SCT2 is connected between the source and gate terminals of FET2. A resistor R1 is connected across secondary winding SW1; and a resistor R2 is connected across secondary winding SW2. A Zener diode Z1a is connected with its cathode to the source of FET1 and with its anode to the anode of a Zener diode Z1b, whose cathode is connected with the gate of FET1. A Zener diode Z2a is connected with its cathode to the source of FET2 and with its anode to the anode of a Zener diode Z2b, whose cathode is connected with the gate of FET2.

A secondary winding SW of leakage transformer LT is connected between ballast output terminals BOT1 and BOT2.

A first fluorescent lamp FL1 is series-connected with a second fluorescent lamp FL2 to form a series-combination; which series-combination is connected between ballasts output terminals BOT1 and BOT2. Lamp FL1 has a first cathode C1a and a second cathode C1b; while lamp FL2 has a first cathode C2a and a second cathode C2b. Each cathode has two cathode terminals. Each of the terminals of cathode C1b is connected with one of the terminals of cathode C2a. Each cathode's terminals are connected with the terminals of one of three separate cathode heater windings CHW.

The leakage transformer of FIG. 9 is illustrated in further detail in FIG. 10. In particular and by way of example, leakage transformer LT includes a first and a second ferrite core element FC1 and FC2, each of which is an extra long so-called E-core; which E-cores abut each other across an air gap AG. Primary winding PW is wound on a first bobbin B1; and secondary winding SW is wound on a second bobbin B2. Cathode heating windings CHW are wound on a small third bobbin B3; which bobbin B3 is adjustably positioned between bobbins B1 and B2.

The operation of the circuit arrangement of FIG. 9 may best be understood by referring to the voltage and current waveforms of FIGS. 11A to 11F.

FIG. 11A shows the waveform of the voltage provided at the output of the half-bridge inverter of FIG. 9 during a situation where lamps FL1 and FL2 are being fully powered. In particular, FIG. 11A shows the waveform of the voltage provided at junction Jf as measured with reference to junction Jc. (The voltage at Jx is substantially equal to the voltage at Jf).

This waveform is substantially equal to that of FIG. 3A.

FIG. 11B shows the corresponding waveform of the gate-to-source voltage (i.e. the control voltage) of FET2.

FIG. 11C shows the corresponding drain current flowing through FET2; which is the current drawn by the upper half of the half-bridge inverter from the DC supply voltage (i.e., from the B+ bus).

FIG. 11D shows the corresponding current flowing through fluorescent lamps FL1 and FL2.

FIG. 11E shows the waveform of the voltage provided at the output of the half-bridge inverter of FIG. 9 for a situation where ballast output terminals BOT1/BOT2 are unloaded except for stray (or parasitic) capacitance associated with the wiring extending between ballast output terminals BOT1/BOT2 and lamp cathodes C1a and C2b.

The waveform of FIG. 11E is substantially equal to that of FIG. 11A except for an increase in the duration of each cycle period.

FIG. 11F shows the corresponding open circuit output voltage present across ballast output terminals BOT1 and BOT2.

Figure 11G:
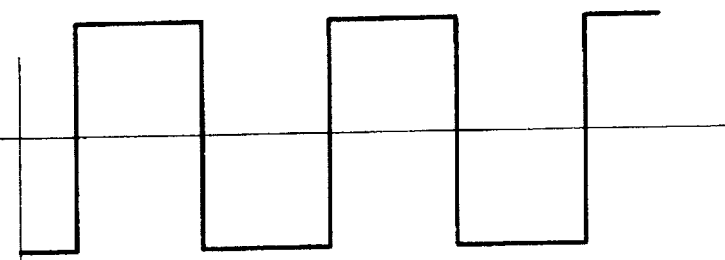

FIG. 11G shows the waveform of the voltage provided at the output of the half-bridge inverter of FIG. 9 for a situation where: (i) slowdown capacitor SDC has been removed; and (ii) ballast output terminals BOT1/BOT2 are unloaded except for stray (or parasitic) capacitance associated with the wiring extending between ballast output terminals BOT1/BOT2 and lamp cathodes C1a and C2b.

It is noted that the waveform of FIG. 11G is substantially a true squarewave as opposed to the trapezoidal (or truncated sinusoidal) waveforms of FIGS. 11A and 11E.

Figure 11H:
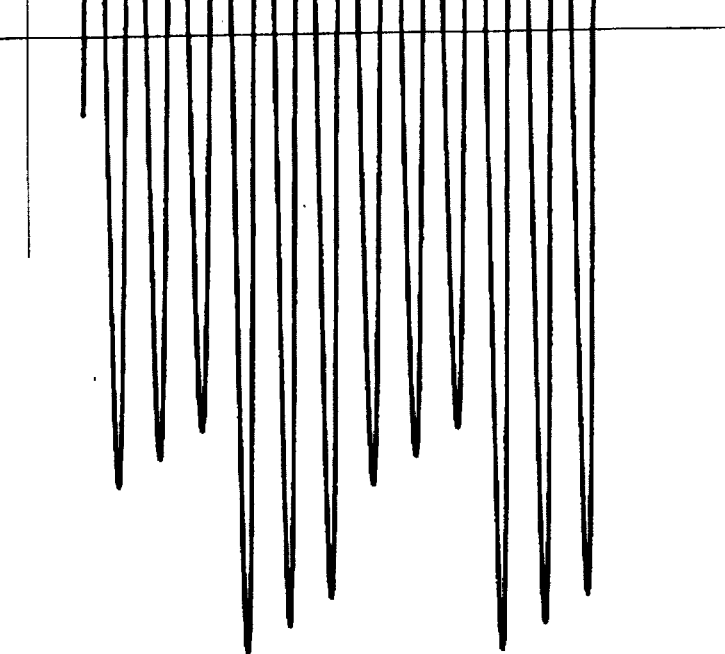

FIG. 11H shows the waveform of the corresponding voltage present across ballast output terminals BOT1 and BOT2.

The basic inverter part of FIG. 9 operates much like the inverter part of FIG. 2, except that the switching transistors are field effect transistors instead of bi-polar transistors.

The loading of the inverter, however, is different. In the circuit of FIG. 9, the inverter's output voltage is applied to the primary winding of a leakage transformer (LT); and the output is drawn from a primary winding of this leakage transformer. In this connection, it is important to notice that a leakage transformer is a transformer wherein there is substantial leakage of magnetic flux between the primary winding and the secondary winding; which is to say that a substantial part of the flux generated by the transformer's primary winding does not link with the transformer's secondary winding.

The flux leakage aspect of transformer LT is illustrated by the structure of FIG. 10. Magnetic flux generated by (and emanating from) primary winding PW passes readily through the high-permeability ferrite of ferrite core FC1. However, as long as secondary winding SW is connected with a load at its output (and/or if there is an air gap, as indeed there is), the flux emanating from the primary winding has to overcome magnetic impedance to flow through the secondary winding; which implies the development of a magnetic potential difference between the legs of the long E-cores—especially between the legs of ferrite core FC1. In turn, this magnetic potential difference causes some of the magnetic flux generated by the primary winding to flow directly between the legs of the E-cores (i.e. directly across the air gap between the legs of the E-cores), thereby not linking with (i.e. flowing through) the secondary winding. Thus, the longer the legs of the E-cores and/or the larger the air gap, the less of the flux generated by the primary winding links with the secondary winding—and conversely. As a result, the magnitude of the current available from the secondary winding is limited by an equivalent internal inductance.

Due to the substantial air gap (AG), the primary winding of leakage transformer LT is capable of storing a substantial amount of inductive energy (just as is the case with inductor 51 of FIG. 2). Stated differently but equivalently, leakage transformer LT has an equivalent input-shunt inductance (existing across the input terminals of its primary or input winding) capable of storing a substantial amount of energy. It also has an equivalent output-series inductance (effectively existing in series with the output terminals of its secondary or output winding) operative to limit the magnitude of the current available from its output. It is important to recognize that the input-shunt inductance is an entity quite separate and apart from the output-series inductance.

Just as in the circuit of FIG. 2, when one of the transistors is switched OFF, the current flowing through primary winding PW can not instantaneously stop flowing. Instead, it must continue to flow until the energy stored in the input-shunt inductance is dissipated and/or discharged. In particular and by way of example, at the moment FET2 is switched OFF, current flows through primary winding PW, entering at the terminal connected with junction Jx and exiting at the terminal connected with junction Jc. Just after the point in time where FET2 is switched OFF, this current will continue to flow, but—since it can not any longer flow through transistor FET2—it must now flow through slow-down capacitor SDC. Thus, the current drawn out of capacitor SDC will cause this capacitor to change its voltage: gradually causing it to decrease from a magnitude of about +160 Volt (which is the magnitude of the DC supply voltage present at the B+ bus as referenced-to junction Jc) to about −160 Volt (which is the magnitude of the DC supply voltage present at the B− bus as referended-to junction Jc). Of course, as soon as it reaches about −160 Volt, it gets clamped by the commutating (or shunting, or clamping) diode built-into FET1; which built-in diode corresponds to shunting diode 67 of the FIG. 2 circuit.

The resulting waveform of the inverter's output voltage will be as illustrated by FIGS. 11A and 11E. The slope of the inverter output voltage as it alternatingly changes between −160 Volt and +160 Volt is determined by two principal factors: (i) the value of the input-shunt inductance of primary winding PW; and (ii) the magnitude of slow-down capacitor SDC. The lower the capacitance of the slow-down capacitor, the steeper the slope. The lower the inductance of the input-shunt inductance, the steeper the slope. Without any slow-down capacitor, the slope will be very steep: limited entirely by the basic switching speed of the inverter's transistors; which, for field effect transistors is particularly high (i.e. fast).

In particular, in the circuit of FIG. 9, the relatively modest up- and down- slopes of the inverter's output voltage (see waveforms of FIGS. 11A and 11E)—which are determined by the capacitance of the slow-down capacitor—are chosen to be far lower than the very steep slopes that result when the slow-down capacitor is removed; which latter situation is illustrated by FIG. 11G. In fact, the slopes of the inverter's output voltage are chosen in such manner as to result in this output voltage having a particularly low content of harmonic components, thereby minimizing potential problems associated with unwanted resonances of the output-series inductance with parasitic capacitances apt to be connected with ballast output terminals BOT1/BOT2 by way of more-or-less ordinary wiring harness means used for connecting between these output terminals and the associated fluorescent lamps (FL1 and FL2).

With the preferred capacitance value of slow-down capacitor SDC, the inverter output voltage waveform will be as shown in FIGS. 11E, and the output voltage provided from secondary winding SW—under a condition of no load other than that resulting from a parasitic resonance involving a worst-value of parasitic output capacitance—will be as shown in FIG. 11F.

On the other hand, without having any slow-down capacitor, the inverter output voltage waveform will be as shown in FIG. 11G, and the output voltage provided from secondary winding SW—under a condition of no load other than that resulting from a parasitic resonance involving a worst-value of parasitic output capacitance—will be as shown in FIG. 11H. Under this condition, the power drawn by the inverter from its DC supply is more than 50 Watt; which power drain result from power dissipations within the inverter circuit and—if permitted to occur for more than a very short period—will cause the inverter to self-destruct.

On the other hand, the power drawn by the inverter under the same identical condition except for having modified the shape of the inverter's output voltage to be like that of FIG. 11E (instead of being like that of FIG. 11G) is only about 3 Watt; which amount of power drain is small enough not to pose any problem with respect to inverter self-destruction, nor even with respect to excessive power usage during extended periods where the inverter ballast is connected with its power source but without actually powering its fluorescent lamp load.

One difference between the circuit of FIG. 2 and that of FIG. 9 involves that fact that the FIG. 9 circuit uses field effect transistors. Never-the-less, the control of each transistor is effected by way of saturable current feedback transformers. However, instead of delivering its output current to a base-emitter junction, each current transformer now delivers its output current to a pair of series-connected opposed-polarity Zener diodes (as parallel-connected with a damping resistor and the gate-source input capacitance). The resulting difference in each transistor's control voltage is seen by comparing the waveform of FIG. 3B with that of FIG. 11B. In either case, however, the transistor is not switched into its ON-state until after the absolute magnitude of the voltage across its switched terminals (i.e. the source-drain terminals for a FET) has substantially diminished to zero.

In further contrast with the arrangement of FIG. 2, the inverter circuit of FIG. 9 is not loaded by way of a series-tuned L-C circuit. Instead, it is in fact loaded with a parallel-tuned L-C circuit; which parallel-tuned L-C circuit consists of the slow-down capacitor SDC as parallel-connected with the input-shunt inductance of primary winding PW. Yet, in complete contrast with other inverters loaded with parallel-tuned L-C circuits, the inverter of FIG. 9 is powered from a voltage source providing a substantially fixed-magnitude (i.e. non-varying) DC voltage.

Also in complete contrast with other inverters loaded with parallel-tuned L-C circuits, the inverter circuit of FIG. 9 provides for clamping (or clipping or truncating) of the naturally sinusoidal resonance voltage that would otherwise (i.e. in the absence of clamping) develop across the parallel-tuned L-C circuit; which naturally sinusoidal resonance voltage is illustrated by the dashed waveform of FIG. 11E.

In the FIG. 9 circuit, the indicated voltage clamping (or clipping or truncating) is accomplished by way of the commutating (or shunting) diodes built into each of the field effect switching transistors. In the FIG. 2 circuit, this clamping is accomplished by shunting diodes 66 and 67.

As previously indicated, to minimize the spurious and potentially damaging resonances which might occur due to an unknown parasitic capacitance becoming connected with ballast output terminals BOT1 and BOT2, it is important to minimize the harmonic content of the inverter's output voltage (which harmonic content—for a symmetrical inverter waveform—consists of all the odd harmonics in proportionally diminishing magnitudes). To attain such harmonic minimization, it is important that the inverter's output voltage be made to match or fit as nearly as possible the waveform of a sinusoidal voltage; which "best fit" occurs when the duration of the up/down-slopes equals about 25% of the total cycle period; which, as can readily be seen by direct visual inspection, corresponds closely to the waveforms actually depicted by FIGS. 3A, 11A and 11E.

However, substantial beneficial effects actually results even if the total duration of the up/down slopes were to be less than 25% of the total duration of the inverter output voltage period. In fact, substantial beneficial effects are attained with up-down slopes constituting as little as 10% of the total cycle period.

Additional Explanations and Comments (a) With reference to FIGS. 2 and 5, adjustment of the amount of power supplied to load 26', and thereby the amount of light provided by lamp 71, may be accomplished by applying a voltage of adjustable magnitude to input terminals IP1 and IP2 of the Toroid Heater; which is thermally coupled with the toroidal ferrite cores of saturable transformers 47, 49.

(b) With commonly available components, inverter circuit 24 of FIG. 2 can be made to operate efficiently at any frequency between a few kHz to perhaps as high as 50 kHz. However, for various well-known reasons (i.e., eliminating audible noise, minimizing physical size, and maximizing efficiency), the frequency actually chosen is in the range of 20 to 40 kHz.

(c) The fluorescent lighting unit of FIG. 1 could be made in such manner as to permit fluorescent lamp 11 to be disconnectable from its base 12 and ballasting means 16. However, if powered with normal line voltage without its lamp load connected, frequency-converting power supply and ballasting circuit 16 is apt to self-destruct.

To avoid such self-destruction, arrangements can readily be made whereby the very act of removing the load automatically establishes a situation that prevents the possible destruction of the power supply and ballasting means. For instance, with the tank capacitor (52) being permanently connected with the lamp load (11)—thereby automatically being removed whenever the lamp is removed—the inverter circuit is protected from self-destruction.

(d) At frequencies above a few kHz, the load represented by a fluorescent lamp—once it is ignited—is substantially resistive. Thus, with the voltage across lamp 11 being of a substantially sinusoidal waveform (as indicated in FIG. 3d), the current through the lamp will also be substantially sinusoidal in waveshape.

(e) In the fluorescent lamp unit of FIG. 1, fluorescent lamp 11 is connected with power supply and ballasting circuit 16 in the exact same manner as is load 26 connected with the circuit of FIG. 2. That is, it is connected in parallel with the tank capacitor (52) of the L-C series-resonant circuit. As is conventional in instant-start fluorescent lamps—such as lamp 11 of FIG. 1—the two terminals from each cathode are shorted together, thereby to constitute a situation where each cathode effectively is represented by only a single terminal. However, it is not necessary that the two terminals from each cathode be shorted together; in which case—for instant-start operation—connection from a lamp's power supply and ballasting means need only be made with one of the terminals of each cathode.

(f) In FIG. 9, a Parasitic Capacitance is shown as being connected across terminals BOT1 and BOT2. The value of this parasitic capacitance may vary over a wide range, depending on unpredictable details of the particular usage situation at hand. Values for the parasitic capacitance will expectedly vary between 100 and 1000 pico-Farad—depending on the nature of the wiring harness used for connecting between the output of secondary winding SW and the plural terminals of lamps FL1/FL2.

(g) The worst case of parasitic oscillation associated with the circuit arrangement of FIG. 9 is apt to occur when the value of the parasitic capacitance (i.e., the capacitance of the ballast-to-lamp wiring harness) is such as to cause series-resonance with the output-series inductance of secondary winding SW at the third harmonic component of the inverter's output voltage. The next worst case of parasitic oscillation is apt to occur when the value of the parasitic capacitance is such as to series-resonate with the output-series inductance at the fifth harmonic component of the inverter's output voltage. With the typical value of 5.4 milli-Henry for the output-series inductance, it takes a total of about 600 pico-Farad to resonate at the third harmonic component of the inverter's 30 kHz output voltage; and it takes about 220 pico-Farad to resonate at the fifth harmonic component of the inverter's output voltage. These capacitance values are indeed of such magnitudes that they may be encountered in an actual usage situation of an electronic ballast. Moreover, at higher inverter frequencies, the magnitudes of the critical capacitance values become even lower.

(h) FIG. 10 shows cathode heater windings CHW placed on a bobbin separate from that of primary winding PW as well as separate from that of secondary winding SW. However, in many situations, it would be better to place the cathode heater windings directly onto the primary winding bobbin B1. In other situations it would be better to place the cathode heater windings directly onto the secondary winding bobbin B2.

If the cathode heater windings are wound on bobbin B1 (i.e. in tight coupling with the primary winding), the magnitude of the cathode heating voltage will remain constant regardless of whether or not the lamp is ignited; which effect is conducive to maximixing lamp life. On the other hand, if the cathode heater windings are wound on bobbin B2 (i.e. in tight coupling with the secondary winding), the magnitude of the cathode heating voltage will be high prior to lamp ignition and low after lamp ignition; which effect is conducive to high luminous efficacy.

By placing the cathode heater windings in a location between primary winding PW and secondary winding SW, it is possible to attain an optimization effect: a maximization of luminous efficacy combined with only a modest sacrifice in lamp life. That is, by adjusting the position of bobbin B3, a corresponding adjustment of the ratio of pre-ignition to post-ignition cathode heater voltage magnitude may be accomplished.

(i) For easier lamp starting, a starting aid capacitor may be used in shunt across one of the fluorescent lamps FL1/FL2.

Also, a starting aid electrode (or ground plane) may advantageously be placed adjacent the fluorescent lamps; which starting aid electrode should be electrically connected with the secondary winding, such as via a capacitor of low capacitance value.

(j) To control (reduce) the degree of magnetic coupling between primary winding PW and secondary winding SW, a magnetic shunt may be positioned across the legs of the E-cores—in a position between bobbins B1 and B3.

(k) Considering the waveforms of FIGS. 1A, 11A and 11E each to include 360 degrees for each full and complete cycle: (i) each half-cycle would include 180 degrees; (ii) each total up-slope would include almost or about 60 degrees degrees; (iii) each total down-slope would include almost or about 60 degrees; and (iv) each horizontal segment would include about 120 degrees or more. Yet, as previously indicated, substantial utility may be attained even if each complete up-slope and down-slope were to include as little 18 degrees.

(l) In the FIG. 9 circuit, the inverter's operating frequency is not ordinarily (or necessarily) equal to the natural resonance frequency of the parallel-tuned L-C circuit that consists of slow-down capacitor SDC and the input-shunt inductance of primary winding PW. Rather, the inverter's actual operating frequency is ordinarily lower than would be this natural resonance frequency.

(m) In a trapezoidal waveform that constitutes a best fit for a sinusoidal waveform, the peak magnitude is lower than that of the sinusoidal waveform, and the up-slope and down-slope are each steeper that the corresponding slopes of the sinusoidal waveform.

(n) The FIG. 9 inverter arrangement has to be triggered into self-oscillation. A suitable automatic triggering means would include a resistor, a capacitor, and a so-called Diac. However, manual triggering may be accomplished by merely momentarily connecting a discharged capacitor (of relatively small capacitance value) between the gate of transistor FET1 and the B+ bus.

(o) Most switching-type field effect transistors have built-in commutating (or shunting) diodes, as indicated in FIG. 9. However, if such were not to be the case, such diodes should be added externally, as indicated in the FIG. 2 circuit.

(p) In ordinary inverter circuits, the inverter output voltage is effectively a squarewave voltage with very steep up-slopes and down-slopes. In inverters using field effect transistors, the time required for the inverter's squarewave output voltage to change between its extreme negative potential to its extreme positive potential is usually on the order of 100 nano-seconds or less. In inverters using bi-polar transistors, this time is usually on the order of 500 nano-seconds or less. In the inverter of the FIG. 9 circuit, however, this time has been extended—by way of the large-capacitance-value slow-down capacitor SDC—to be on the order of several micro-seconds, thereby achieving a substantial reduction of the magnitudes of the harmonic components of the inverter's (now trapezoidal) output voltage.

(q) In an actual prototype of the FIG. 9 ballast circuit—which prototype was designed to properly power two 48 inch 40 Watt T-12 fluorescent lamps—the following approximate parameters and operating results prevailed:

1. operating frequency: about 30 kHz;
2. slow-down capacitor: 0.02 micro-Farad;
3. shunt-input inductance: 1.4 milli-Henry;
4. up-slope duration: about 4 micro-seconds;
5. down-slope duration: about 4 micro-seconds;
6. series-output inductance: 5.4 milli-Henry;
7. parasitic capacitance across BOT1/BOT2 terminals; 800 pico-Farad;
8. power consumption when unloaded: about 4 Watt;
9. power consumption when loaded with two F40/T12 fluorescent lamps: about 70 Watt;
10. power consumption when unloaded but with slow-down capacitor removed: about 80 Watt.

It is be noted that the natural resonance frequency of the L-C circuit consisting of a slow-down capacitor of 0.02 micro-Farad as parallel-combined with a shunt-input inductance of about 1.4 milli-Henry is about 30 kHz. This means that—as far as the fundamental component of the 30 kHz inverter output voltage is concerned—the parallel-tuned L-C circuit represents a very high impedance, thereby constituting no substantive loading on the inverter's output.

(r) Of course, the FIG. 9 ballast circuit can be made in the form of a push-pull circuit such as illustrated by FIG. 7; in which case center-tapped transformer 96 would be modified in the sense of being made as a leakage transformer in full correspondence with leakage transformer LT of FIG. 9. Also, of course, inductor 119, capacitor 118, and load 121 would be removed. Instead, the load would be placed at the output of the secondary winding of the modified center-tapped transformer 96; which would be made such as to have appropriate values of input-shunt inductance and output-series inductance. Capacitor 117 would constitute the slow-down capacitor.

(s) It is thought that the present invention and many of its attendant advantages will be understood from the foregoing description and that many changes may be made in the form and construction of its components parts, the form described being merely a preferred embodiment of the invention.

I claim:

1. An arrangement comprising:
   a pair of power line terminals at which is provided a power line voltage;
   rectification and filtering circuitry connected with the power line terminals and operative to provide a DC supply voltage at a set of DC terminals; the absolute magnitude of the DC supply voltage being substantially constant; and
   inverter and load circuitry connected with the DC terminals and operative to provide an AC voltage at a pair of AC terminals with which is connected a gas discharge lamp; thereby to cause an alternating lamp current to flow through the lamp; the alternating lamp current having a peak magnitude and an RMS magnitude; the AC voltage being of a frequency substantially higher than that of the power line voltage on an ordinary electric utility power line; the inverter and load circuitry being additionally characterized by causing the peak magnitude of the alternating lamp current to be distinctly lower than twice its RMS magnitude.

2. The arrangement of claim 1 wherein the absolute magnitude of the DC voltage is about twice as high as the peak absolute magnitude of the power line voltage.

3. The arrangement of claim 1 wherein:
   (a) the gas discharge lamp (i) at certain times draws a lamp current from the AC terminals, (ii) at certain other times, such as if disconnected or otherwise non-functional, draws no lamp current; and (b) the inverter and load circuitry is characterized by the fact that the frequency of the AC voltage is substantively higher during said certain other times as compared with during said certain times.

4. A ballasting arrangement for a gas discharge lamp, comprising:
   a source providing a DC supply voltage at a set of DC terminals; and
   an inverter circuit assembly connected with the DC terminals and operative to provide an inverter output current from a pair of inverter output terminals; the inverter output current being an alternating current of frequency substantially higher than that of the power line voltage on an ordinary electric utility power line; the inverter circuit assembly also including a pair of lamp output terminals adapted to connect with and to supply a lamp current to a gas discharge lamp; the inverter circuit assembly being otherwise characterized by having: (i) an inductor means connected between one of the inverter output terminals and one of the lamp output terminals, the inductor means having a frequency-dependent impedance in the sense that its impedance increases with increasing frequency of any current flowing through it; (ii) a frequency control sub-assembly operative, on receipt of a control action at a control action input, to control the frequency and thereby the magnitude of the inverter output current; and (iii) an action-generating element-operative, in response to at least a part of the inverter output current, to provide a control action at a control action output; the control action output being connected in communication with the control action input, thereby to supply thereto said control action, thereby to cause the frequency of the inverter output current to change in response to the magnitude of the inverter output current, thereby to cause the magnitude of the inverter output current to be different from what it would have been in the absence of providing the control action to the frequency control sub-assembly.

5. The ballasting arrangement of claim 4 wherein, by providing said control action to the frequency control sub-assembly, the magnitude of said part of the inverter output current is lower than it would have been in the absence of providing the control action to the frequency control sub-assembly.

6. The ballasting arrangement of claim 4 wherein the provision of said control action to the frequency control sub-asembly constitutes negative feedback in the sense that, if the magnitude of said part of the inverter output current were to change due to a change in the characteristics of a circuit element connected within the inverter circuit assembly, such a change in magnitude will be less because of the provision of said control action to the frequency control sub-assembly than it would have been without the provision of said control action to the frequency control sub-assembly.

7. The ballasting arrangement of claim 4 wherein, if the characteristics of a circuit element connected within the inverter circuit assembly were to be altered, such as by altering the inductance of the inductor means, the magnitude of said part of the inverter output current would change by a certain amount; which certain amount will be less when actually providing said control action to the frequency control sub-assembly than when not providing said control action to the frequency control sub-assembly.

8. An arrangement comprising:
   a source providing a DC supply voltage at a set of DC terminals;
   an inverter circuit connected with the DC terminals and operative to provide an AC inverter output voltage at a pair of inverter output terminals; the AC inverter output voltage being of frequency substantially higher than that of the power line voltage on an ordinary electric utility power line; the inverter circuit having a frequency-controlling sub-assembly having a control action input operative, on receipt of a control action signal, to control the frequency of the AC inverter output voltage;
   an output circuit connected between the inverter output terminals and a pair of lamp current output terminals; the output circuit being characterized by including: (i) a frequency-dependent impedance element, such as an inductor; and (ii) an action-signal-generating element having a control action output connected in communication with said control action input and operative to provide said control action signal in response to a current flowing in the output circuit, thereby to affect the frequency of the AC inverter output voltage and, therefore, the magnitude of said current; whereby the magnitude of said current is different from what it would have been if said control action signal had not been provided to the control action input; and
   a gas discharge lamp connected with the lamp current output terminals.

9. The arrangement of claim 8 wherein the action-signal-generating element is operative to provide said control action signal to the control action input in such a manner that any change in the magnitude of said current that might occur due to a reason other than the provision of the control action signal itself will be reduced as a result of providing the control action signal.

10. A ballasting arrangement for a gas discharge lamp, comprising:
    a source providing a DC supply voltage at a set of DC terminals; and
    an assembly of components connected with the DC terminals and operative to provide an AC voltage at a pair of first terminals; the assembly being characterized by including various electrical components in addition to output circuitry having an action-generating element operative to provide a control action at a control action output in response to a current flowing in a certain conductor included as part of the output circuitry; the AC voltage being of frequency substantially higher than that of the power line voltage on an ordinary electric utility power line; the assembly also including a pair of second terminals connected with the first terminals by way of the output circuitry; the second terminals being adapted to connect with and to supply lamp current to a gas discharge lamp; the assembly being otherwise characterized by: (a) including an inductor as part of the output circuitry; (b) having a control sub-assembly operative, on receipt of a control action at a control action input, to control the frequency of the AC voltage, the control action input being functionally connected with the control action output; and (c) causing a current to flow through the certain conductor; thereby: (i) to cause said control action to be supplied from the control action output to the control action input, (ii) to cause the frequency of the AC voltage to be controlled in response to the current flowing through the certain conductor, and (iii) to cause the magnitude of this current to be different from what it would have been in the absence of providing the control action to the control action input.

11. The ballasting arrangement of claim 10 wherein the action-generating element is functional to provide the control action to the control action input in such a manner that any change in the magnitude of the current flowing in said conductor which might occur due to a reason other than the provision of the control action output itself will be reduced as a result of actually providing the control action.

12. An arrangement comprising:

a source providing a DC supply voltage at a set of DC terminals;

an inverter circuit assembly connected with the DC terminals and operative to provide an AC inverter voltage at a pair of AC inverter terminals; the AC inverter voltage being of a frequency substantially higher than that of the power line voltage on an ordinary electric utility power line; the inverter circuit assembly being characterized by including a control subassembly operative, on receipt of a control action at a control action input, to control the frequency of the AC inverter voltage; and load circuitry connected with the AC inverter terminals; the load circuitry being characterized by: (a) including a disconnectable gas discharge lamp; (b) including an inductor; (c) including a conductor; (d) including an action-generating element connected in circuit with the conductor and operative to provide a control action at a control action output in response to a current flowing through the conductor; and (e) having the control action output connected in communication with the control action input, thereby: (i) to provide the control action such as to cause: (i) the frequency of the AC inverter voltage to be controlled in response to the magnitude of the current flowing through the conductor, and (ii) the magnitude of this current to be different from what it would have been in the absence of providing the control action to the control action input.

13. The arrangement of claim 12 wherein the effect of providing the control action is that of causing the frequency of the AC inverter voltage to increase as compared with a situation where the control action is absent.

14. The arrangement of claim 12 wherein the AC output voltage is characterized by having a waveform consisting of: (i) a first time-segment during which the instantaneous magnitude of the AC inverter voltage remains at a substantially constant negative level; (ii) a second time-segment during which the instantaneous magnitude of the AC inverter voltage increases in a substantially continuous manner; (iii) a third time-segment during which the instantaneous magnitude of the AC inverter voltage remains at a substantially constant positive level; and (iv) a fourth time-segment during which the instantaneous magnitude of the AC inverter voltage decreases in a substantially continuous manner.

15. An arrangement comprising:

a source providing a DC supply voltage at a set of DC terminals; and inverter and load circuitry connected with the DC terminals and operative to provide an AC voltage at a pair of AC terminals; the AC voltage being of a frequency substantially higher than that of the power line voltage on an ordinary electric utility power line; the inverter and load circuitry being characterized by including (i) an inductor, (ii) a capacitor, (iii) a gas discharge lamp, and (iv) an intermittently conducting transistor; the AC voltage being characterized by having a waveform consisting of: (i) a first time-segment during which the instantaneous magnitude of the AC voltage remains at a substantially constant negative level, (ii) a second time-segment during which the instantaneous magnitude of the AC voltage increases in a substantially continuous manner, (iii) a third time-segment during which the instantaneous magnitude of the AC voltage remains at a substantially constant positive level, and (iv) a fourth time-segment during which the instantaneous magnitude of the AC voltage decreases in a substantially continuous manner; the inverter and load circuitry being further characterized in that substantially no current flows through the transistor during the second and fourth time-segments.

16. An arrangement comprising:

a source providing a DC supply voltage at a set of DC terminals; and inverter and load circuitry connected with the DC terminals and operative to provide an AC voltage at a pair of AC terminals with which is connected a gas discharge lamp; the AC voltage being of a frequency substantially higher than that of the power line voltage on an ordinary electric utility power line; the gas discharge lamp being characterized by drawing a lamp current from the AC terminals at certain times and not at other times; the inverter and load circuitry being characterized in that the frequency of the AC voltage is different during the times when lamp current is being drawn as compared with times when lamp current is not being drawn.

17. The arrangement of claim 16 wherein the frequency of the AC voltage is lower during the times when lamp current is being drawn as compared with the times when lamp current is not being drawn.

18. The arrangement of claim 1 wherein the inverter and load circuitry is also characterized by including an L-C circuit electrically connected with the AC terminals and having a natural resonance frequency at or near the fundamental frequency of the AC voltage.

19. The arrangement of claim 1 wherein the inverter and load circuitry is also characterized by including a transistor having a pair of transistor terminals across which exists a transistor voltage and between which periodically flows a transistor current; the transistor current flowing only during periods when the absolute magnitude of the transistor voltage is substantially lower than that of the DC supply voltage.

20. The arrangement of claim 19 further defined in that current flows between the transistor terminals only during periods when the absolute magnitude of the transistor voltage is smaller than that of the DC supply voltage by a factor of ten or more.

21. The arrangement of claim 1 wherein the inverter and load circuitry is also characterized by including a certain terminal at which, as referenced to one of the DC terminals, exists a substantially sinusoidal voltage of frequency equal to that of the AC voltage.

22. The arrangement of claim 21 further defined by: (i) including a periodically conducting transistor having a transistor terminal; and (ii) having a conductive path between the transistor terminal and said certain terminal, the ohmic resistance of which conductive path being of negligible magnitude.

23. The arrangement of claim 1 wherein the inverter and load circuitry is also characterized by including a transistor having a pair of transistor terminals between which periodically flows a transistor current, which periodic transistor current has a period equal to that of the AC voltage and, for each complete cycle of the AC voltage, flows for a total time duration that is distinctly shorter than 50% of the total duration of said complete cycle.

24. The arrangement of claim 1 wherein the inverter and load circuitry is also characterized by including a transistor having a pair of transistor terminals across which exists a periodic transistor voltage and between which flows a transistor current in the form of periodic unidirectional current pulses; the duration of each unidirectional current pulse being distinctly shorter than half the duration of a complete cycle of the AC voltage.

25. The arrangement of claim 1 wherein the inverter and load circuitry is further defined in that the frequency of the AC voltage is distinctly higher just prior to lamp ignition than it is after the lamp has ignited.

26. The arrangement of claim 1 wherein the inverter and load circuitry is further defined in that the frequency of the AC voltage would increase if the gas discharge lamp were to be disconnected.

27. The arrangement of claim 1 wherein the inverter and load circuitry is also characterized by including: (i) a transistor having a pair of transistor terminals; (ii) a first and a second conductor between which exists an alternating voltage of substantially sinusoidal waveform and with frequency equal to that of the AC voltage, the first conductor being characterized by having an AC potential substantially equal to that of one of the DC terminals, the second conductor being characterized by having a DC potential equal to one of the transistor terminals.

28. The arrangement of claim 27 yet additionally characterized by having a capacitor connected between said one of the transistor terminals and a termination point having an AC potential substantially equal to that of one of the DC terminals.

29. The arrangement of claim 1 wherein the inverter and load circuitry is also characterized by including: (i) a transistor having a transistor terminal; (ii) a first and a second conductor between which exists a substantially sinusoidal voltage of frequency equal to that of the AC voltage, the first conductor being characterized by having an AC potential substantially equal to that of one of the DC terminals, the second conductor being characterized by having a DC potential equal to the transistor terminal.

\* \* \* \* \*